United States Patent
Tomioka et al.

(10) Patent No.: US 7,782,620 B2
(45) Date of Patent: Aug. 24, 2010

(54) ELECTRONIC APPARATUS

(75) Inventors: Kentaro Tomioka, Sayama (JP);
Tomomi Murayama, Nishitama-gun (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/429,948

(22) Filed: Apr. 24, 2009

(65) Prior Publication Data
US 2009/0296354 A1 Dec. 3, 2009

(30) Foreign Application Priority Data
May 30, 2008 (JP) .............................. 2008-143320

(51) Int. Cl.
*H05K 7/20* (2006.01)
(52) U.S. Cl. ...................... 361/704; 361/700; 361/719; 257/706; 257/712; 257/715; 165/80.3
(58) Field of Classification Search ...................... None
See application file for complete search history.

(56) References Cited

U.S. PATENT DOCUMENTS

| | | | | |
|---|---|---|---|---|
| 5,862,038 A * | 1/1999 | Suzuki et al. | ............... | 361/704 |
| 6,281,573 B1 * | 8/2001 | Atwood et al. | ............... | 257/706 |
| 6,713,863 B2 * | 3/2004 | Murayama et al. | .......... | 257/707 |
| 7,268,428 B2 * | 9/2007 | Edwards et al. | ............. | 257/712 |
| 7,498,673 B2 * | 3/2009 | Awad et al. | ................. | 257/718 |
| 7,499,280 B2 * | 3/2009 | Otsuki et al. | ................ | 361/704 |
| 7,547,582 B2 * | 6/2009 | Brunschwiler et al. | ...... | 438/123 |
| 7,554,191 B2 * | 6/2009 | Inomata et al. | ............. | 257/706 |
| 2004/0150118 A1 | 8/2004 | Honda | | |
| 2006/0215369 A1 | 9/2006 | Ohashi et al. | | |
| 2009/0289350 A1 | 11/2009 | Watanabe | | |

FOREIGN PATENT DOCUMENTS

| | | |
|---|---|---|
| JP | 11-163231 | 6/1999 |
| JP | 2003-168772 | 6/2003 |
| JP | 2004-260138 | 6/2004 |
| JP | 2005-101259 | 4/2005 |
| JP | 2006-269639 | 10/2006 |
| WO | 20071037055 | 4/2007 |

OTHER PUBLICATIONS

Japanese Patent Application No. 2008-143320, Notice of Rejection, mailed Mar. 9, 2010 (English translation).

* cited by examiner

*Primary Examiner*—Boris L Chervinsky
(74) *Attorney, Agent, or Firm*—Blakely, Sokoloff, Taylor & Zafman LLP

(57) ABSTRACT

According to one embodiment, an electronic apparatus includes a semiconductor package including a resin substrate and a die mounted on the resin substrate, a printed circuit board on which the semiconductor package is mounted, and a heat receiving plate that has an area larger than an area of the die. The heat receiving plate has a concave portion that corresponds to a surface of the die at a normal temperature. The concave portion is provided with a pasty heat conductive agent. The heat receiving plate is thermally connected to the semiconductor package via the pasty heat conductive agent.

6 Claims, 18 Drawing Sheets

ELECTRONIC APPARATUS

CROSS-REFERENCE TO RELATED APPLICATIONS

This application is based upon and claims the benefit of priority from Japanese Patent Application No. 2008-143320, filed May 30, 2008, the entire contents of which are incorporated herein by reference.

BACKGROUND

1. Field

One embodiment of the invention relates to an electronic apparatus.

2. Description of the Related Art

In an electronic apparatus such as a personal computer, electronic components are mounted on a printed circuit board (printed board) on which a wiring pattern is formed. The electronic components mounted on the printed circuit board include a central processing unit (CPU), capacitors, control integrated circuits (ICs), and a power supply unit, and they generate a relatively large amount of heat during operation. Accordingly, the electronic apparatus is configured to radiate the heat generated by the electronic components during operation.

For example, Japanese Patent Application Publication (KOKAI) No. 2005-101259 discloses a power module assembly in which a heat radiating plate fixed to a power module is attached to a heat radiating case with heat conductive grease, a groove is formed at least on the surface of the heat radiating plate to which the heat radiating case is attached or on the surface of the heat radiating case to which the heat radiating plate is attached, and injection holes for injecting the heat conductive grease into the space between the heat radiating plate and the heat radiating case are formed on the heat radiating plate or the heat radiating case.

BRIEF DESCRIPTION OF THE SEVERAL VIEWS OF THE DRAWINGS

A general architecture that implements the various features of the invention will now be described with reference to the drawings. The drawings and the associated descriptions are provided to illustrate embodiments of the invention and not to limit the scope of the invention.

DETAILED DESCRIPTION

Various embodiments according to the invention will be described hereinafter with reference to the accompanying drawings. In general, according to one embodiment of the invention, an electronic apparatus includes: a semiconductor package comprising a resin substrate and a die mounted on the resin substrate; a printed circuit board on which the semiconductor package is mounted; and a heat receiving plate having an area larger than an area of the die, wherein the heat receiving plate has a concave portion corresponding to a shape of a surface of the die at a normal temperature, the concave portion is provided with a pasty heat conductive agent, and the heat receiving plate is thermally connected to the semiconductor package via the pasty heat conductive agent.

According to another embodiment of the invention, an electronic apparatus includes: a semiconductor package comprising a resin substrate and a die mounted on the resin substrate; a printed circuit board on which the semiconductor package is mounted; and a heat receiving plate having an area larger than an area of the die, wherein the die has a concave portion that is provided with a pasty heat conductive agent, and the die is thermally connected to the heat receiving plate via the pasty heat conductive agent.

Figure 17:
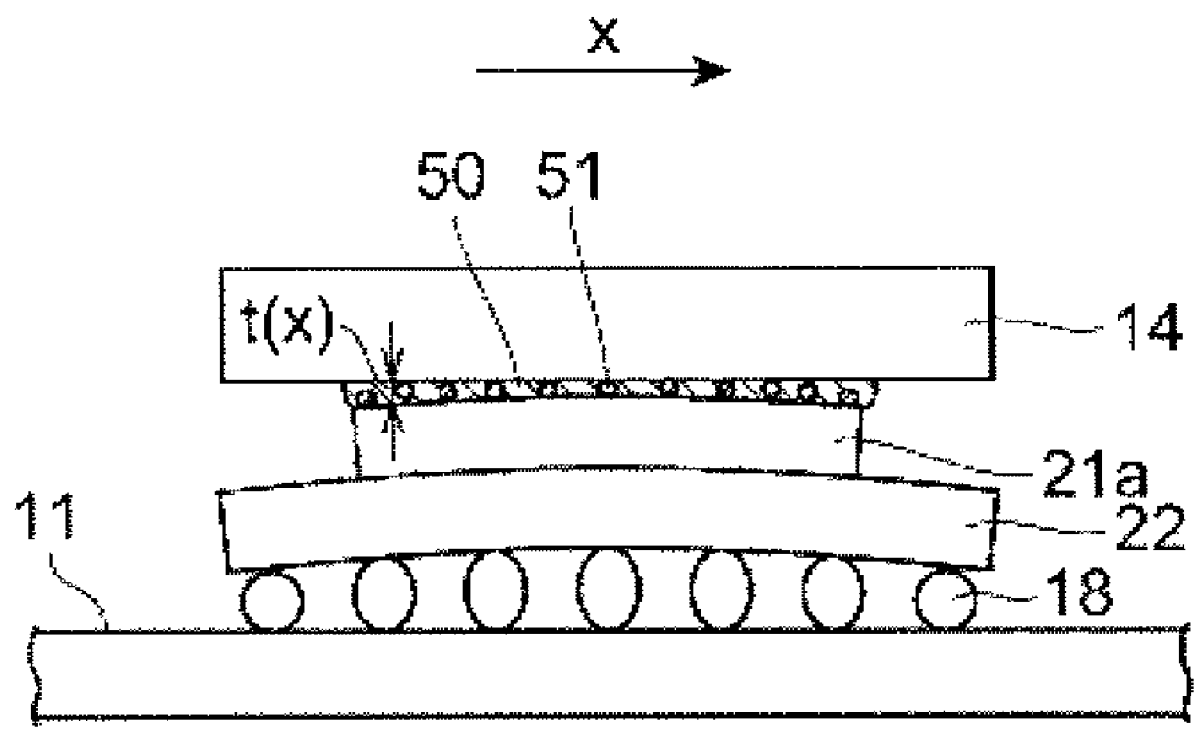
FIG. 17 is an exemplary schematic diagram of a semiconductor package, a grease, and a heat receiving plate of a conventional electronic apparatus at the normal temperature.

To begin with, a configuration of a typical semiconductor package, which is widely used, is described below. As illustrated in FIG. 17, a semiconductor package such as a ball grid array (BOA) includes a resin substrate 22; a die 21a that is mounted the top surface of a resin substrate 22 and that includes a CPU, a control IC, and a power supply unit; and solder balls 18 that are fixed to a bottom surface of the resin substrate 22 by soldering. The semiconductor package is fixed to the printed circuit board 11 via the solder balls 18 by soldering.

The die 21a and the resin substrate 22 that has a coefficient of linear expansion higher than that of the die 21a are fixed to each other by a process that requires a higher temperature, such as soldering. As a result, at a normal temperature, a surface of the die 21a to be thermally connected to a heat receiving plate 14 (hereinafter, "thermal connection surface") is convex with respect to the heat receiving plate 14. Given that a thermal connection surface of the heat receiving plate 14 with respect to the die 21a is flat, the space between the heat receiving plate 14 and the die 21a has a concave shape, in which the interval between the heat receiving plate 14 and the die 21a is the smallest in a center portion of the space.

The space between the heat receiving plate 14 and the die 21a is filled with a grease 50 serving as a heat conductive agent. Fillers 51 such as ceramics or metal powder that increase the heat conductivity are mixed into the grease 50. The heat receiving plate 14 is pressed against the die 21a with a standard pressure. The interval between the heat receiving plate 14 and the die 21a is maintained at an interval t(x) in a position in the direction x indicated by the arrow illustrated in FIG. 17 based on the viscosity of the grease 50 and the size of the filler 51. Specifically, the size of the filler 51 is taken as the interval t(x) between the heat receiving plate 14 and the die 21a in the center portion of the space, and the interval t(x) between the heat receiving plate 14 and the die 21a in portions other than the center portion is determined based on the interval t(x) of the center portion.

Figure 18:
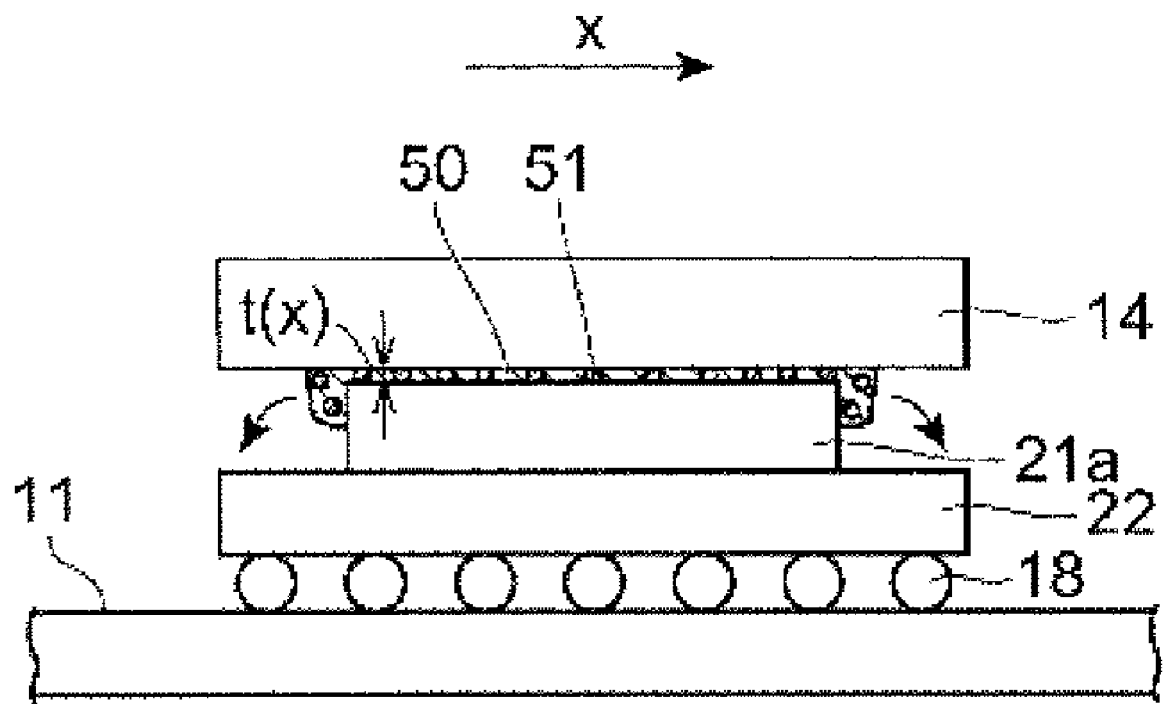
FIG. 18 is an exemplary schematic diagram of the semiconductor package, the grease, and the heat receiving plate of the conventional electronic apparatus during operation.

On the other hand, during operation, as illustrated in FIG. 18, the temperature of the die 21a increases to a temperature close to the temperature at which the die 21a and the resin plate 22 are fixed to each other, so that the shape of the thermal connection surface of the die 21a changes from the convex shape to an approximately flat shape with a smaller curvature. During operation, the interval t (x) in the center portion of the space determined by the size of the filler 51 hardly changes while the interval t(x) in the portions other than the center portion decreases with a decrease in the curvature. Accordingly, the volume of the space between the heat receiving plate 14 and the die 21a (hereinafter, "space volume") decreases, so that a part of the grease 50 corresponding to the volume of the reduced space is extruded from the thermal connection surface. In addition, the grease 50 expands at the temperature during operation, which accelerates the extrusion of the grease 50. The extrusion of the grease 50 easily causes unstable thermal connection between the heat receiving plate 14 and the die 21a.

Described below is a personal computer (hereinafter, "computer") 1 as an electronic apparatus according to a first embodiment of the present invention with reference to FIGS. 1 to 3.

Figure 1:
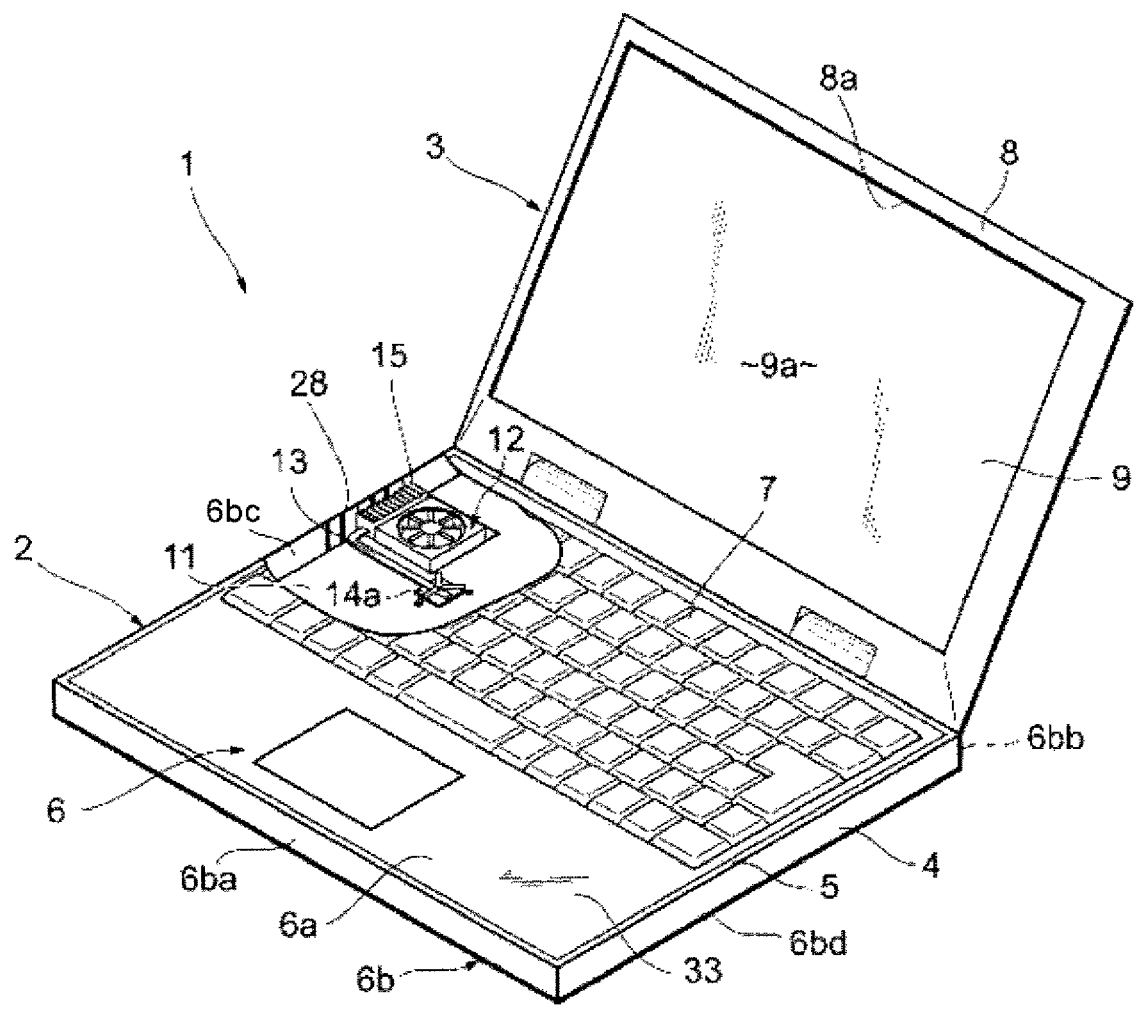
FIG. 1 is an exemplary perspective view of an electronic apparatus according to a first embodiment of the invention, partly depicting an internal configuration of the electronic apparatus.

FIG. 1 is a perspective view of the personal computer 1, partly depicting an internal configuration of the computer 1. FIG. 2 is a perspective view of an internal part of the computer 1. FIG. 3 is a plan view of a heat radiation mechanism on a printed circuit board housed in the computer 1. As illustrated in FIG. 1, the computer 1 includes a computer body 2 and a display unit 3.

The computer body 2 includes a body base 4 and a body cover 5. The body cover 5 is attached to the upper surface of the body base 4. The body base 4 and the body cover 5 cooperatively constitute a cuboidal chassis 6.

The chassis 6 includes a top wall 6a, a circumferential wall 6b, and a bottom wall 5c. The top wall 6a supports a key board 7. The circumferential wall 6b includes a front circumferential wall 6ba, a back circumferential wall 6bb, a left circumferential wall 6bc, and a right circumferential wall 6bd.

The display unit 3 includes a display housing 8 and a liquid crystal display panel 9 that is incorporated in the display housing 8. The liquid crystal display panel 9 includes a display screen 9a. The display screen 9a is exposed to the outside of the display housing 8 via an opening 8a of the display housing 8.

The display unit 3 is supported on a back end portion of the chassis 6 via a hinge mechanism (not illustrated) with which the display unit 3 is rotatable between a closing position where the display unit 3 inclines such that the display unit 3 covers the top surface of the top wall 6a and an opening position where the display unit 3 rises such that the top wall 6a is uncovered.

Figure 2:
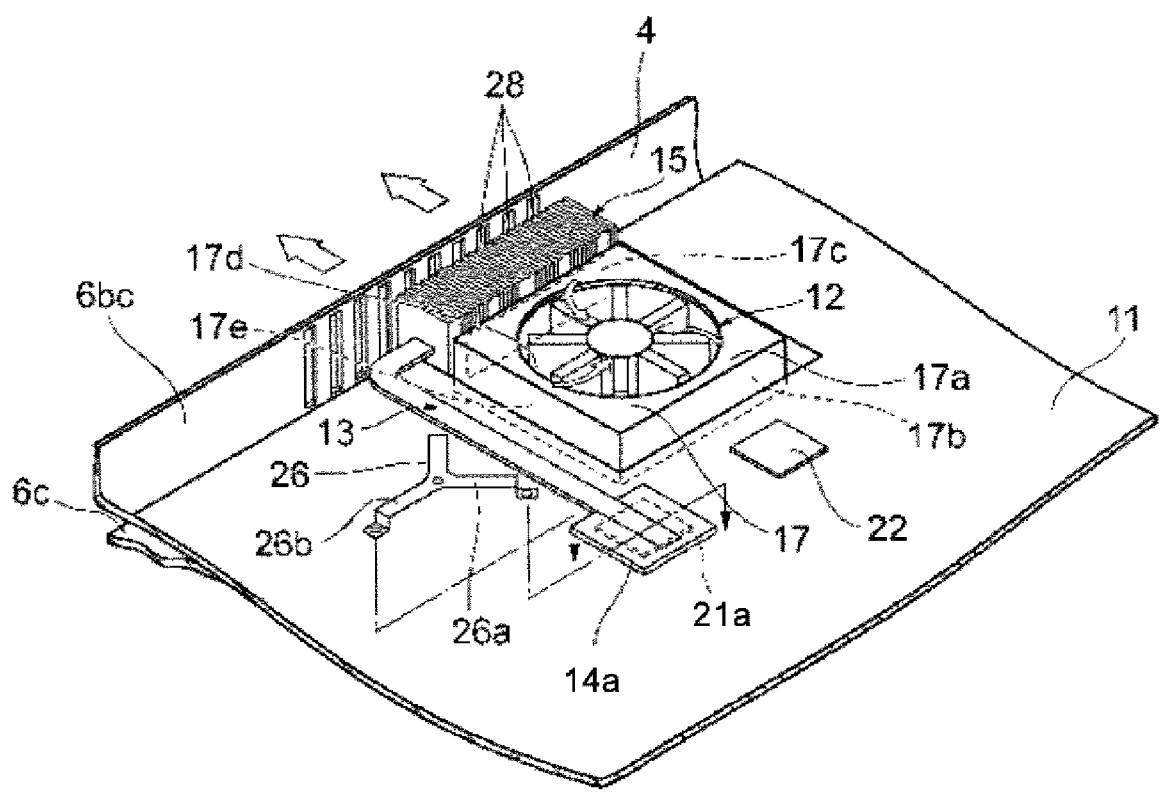
FIG. 2 is an exemplary perspective view of an internal part of the electronic apparatus according to the first embodiment.

As illustrated in FIG. 2, the chassis 6 houses a printed circuit board 11, a cooling fan 12, a heat pipe 13, and a heat radiation fin 15. On a top surface of the printed circuit board 11, a semiconductor package including the die 21a is mounted and other circuit components (not illustrated). Among the circuit components mounted on the printed circuit board 11, particularly, the die 21a generates a larger amount of heat and the heat is required to be positively radiated. The die 21a includes various types of electronic components that generate heat required to be radiated, such as a CPU or a graphics chip.

Figure 3:
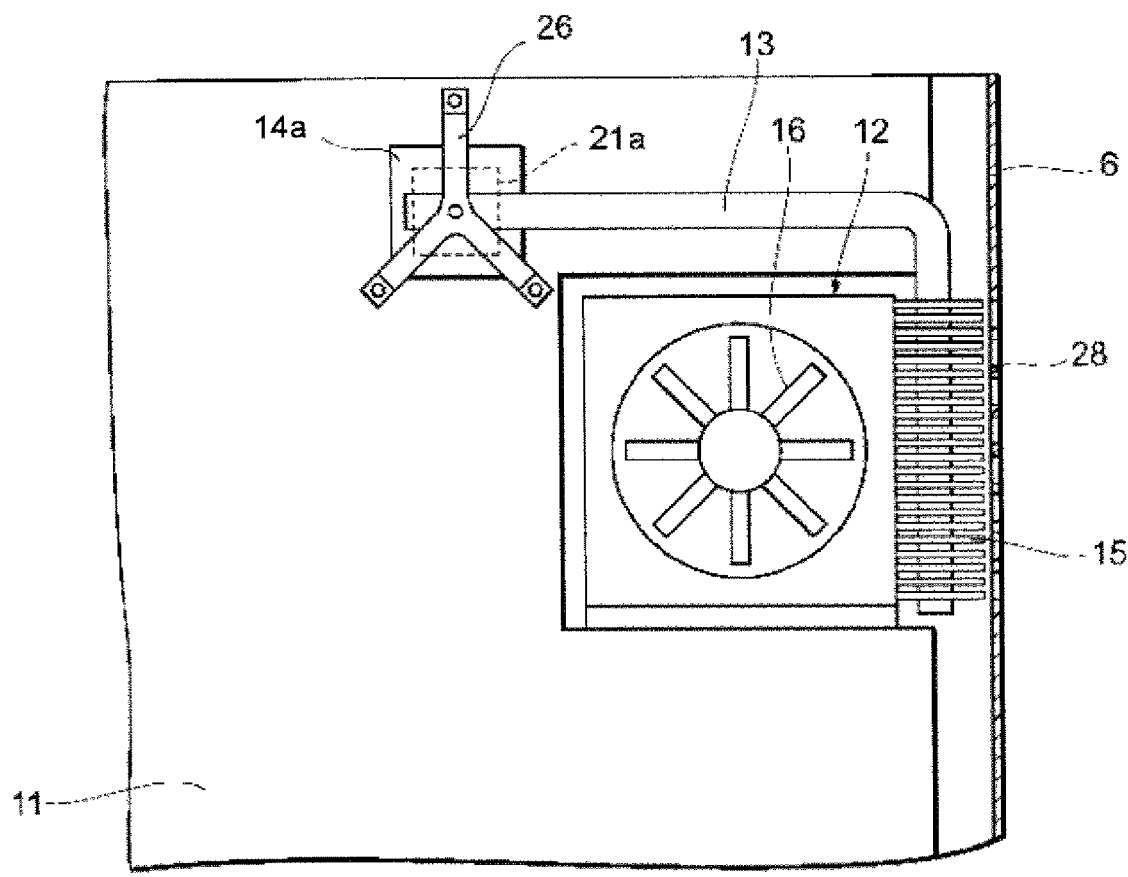
FIG. 3 is an exemplary plan view of a heat radiation mechanism on a printed circuit board housed in the electronic apparatus according to the first embodiment.

As illustrated in FIG. 3, the die 21a is made of a material having excellent heat conductivity, such as copper. A heat receiving plate 14a that is rectangular and has an area larger than that of the die 21a is connected to the die 21a via the grease 50 serving as a pasty heat conductive agent. The heat pipe 13 is a heat conductive tube made of a material having excellent heat conductivity, such as copper. One of the ends of the heat pipe 13 is connected to the heat receiving plate 14a and the other end is connected to the heat radiation fin 15.

The heat receiving plate 14a is fixed to the printed circuit board 11 with a fixation member 26. The fixation member 26 includes a three-pronged cover portion 26a that supports the heat receiving plate 14a, and a leg portion 26b that extends from the cover member 26a toward the printed circuit board 11 and is fixed to the printed circuit board 11 with screws. The heat receiving plate 14a is interposed between the printed circuit board 11 and the fixation member 26, so that the heat receiving plate 14a is fixed.

The heat pipe 13 extends from its end connected to the heat receiving plate 14a toward the left circumferential wall 6bc of the chassis 6 on the printed circuit board 11. The die 21a is more close to the front circumferential wall 6ba of the chassis 6 than the cooling fan 12 is.

The heat pipe 13 extends to the outside of the printed circuit board 11 and is bent to the heat radiation fin 15. An end portion of the heat pipe 13 extends along a discharge surface 17c of the cooling fan 12 and penetrates a plurality of fin elements of the fin 15. In other words, the fin elements each having a hole at its center are fitted to the heat pipe 13, so that the heat radiation fin 15 is formed.

The heat pipe 13 is provided between the die 21a and the heat radiation fin 15. One of the ends of the heat pipe 13 is thermally connected to the die 21a. The heat pipe 13 contains a hydraulic fluid, and conducts heat by use of heat of evaporation and capillarity. The heat pipe 13 conducts the heat generated by the die 21a to the heat radiation fin 15. For example, a heat pipe having a diameter of 6 millimeters is vertically thinned to a thickness of approximately 3 millimeters, and the thinned heat pipe is used as the heat pipe 13 to increase the area of the heat pipe 13 on the heat receiving plate 14a.

As illustrated in FIG. 2, the cooling fan 12 is arranged in a position near the left circumferential wall 6bc of the chassis 6. The cooling fan 12 includes a fan housed in a hexahedral housing case 17 having a smaller thickness. The fan rotates on a rotation shaft (not illustrated) provided in the thickness direction of the housing case 17. The housing case 17 includes intake surfaces 17a and 17c that are opposed to each other, and that have intake holes 17d and 17e in their centers, respectively; and a discharge surface 17c that is a side surface of the housing case 17, and that has a discharge hole. The cooling fan 12 intakes the air from the intake surfaces 17a and 17b and discharges the air from the discharge surface 17c.

The cooling fan 12 is fixed such that the intake surfaces 17a and 17b extend along the top surface of the printed circuit board 11 and the discharge surface 17c is opposed to the heat radiation fin 15. A plurality of discharge holes 28 are formed on the left circumferential wall 6bc of the chassis 6 corresponding to the cooling fan 12. The discharge holes 28 penetrate the left circumferential wall 6bc to the outside of the chassis 6.

The heat radiation fin 15 is arranged in a position not on the printed circuit board 11 and near the left circumferential wall 6bc of the chassis 6. Specifically, as illustrated in FIG. 2, the heat radiation fin 15 is arranged between the discharge surface 17c of the cooling fan 12 and the discharge holes 28 on the left circumferential wall 6bc. The heat radiation fin 15 extends along a direction approximately orthogonal to a direction in which the air from the cooling fan 12 flows (hereinafter, "air flow direction"), and the fin elements of the heat radiation fin 15 are arranged in parallel to each other and extends along the air flow direction. Each of the fin elements is a rectangular member made of, for example, metal having higher heat conductivity, such as aluminum. The fin elements are arranged with intervals such that the surface of each of the fin elements extends along the air flow direction.

Figure 4:
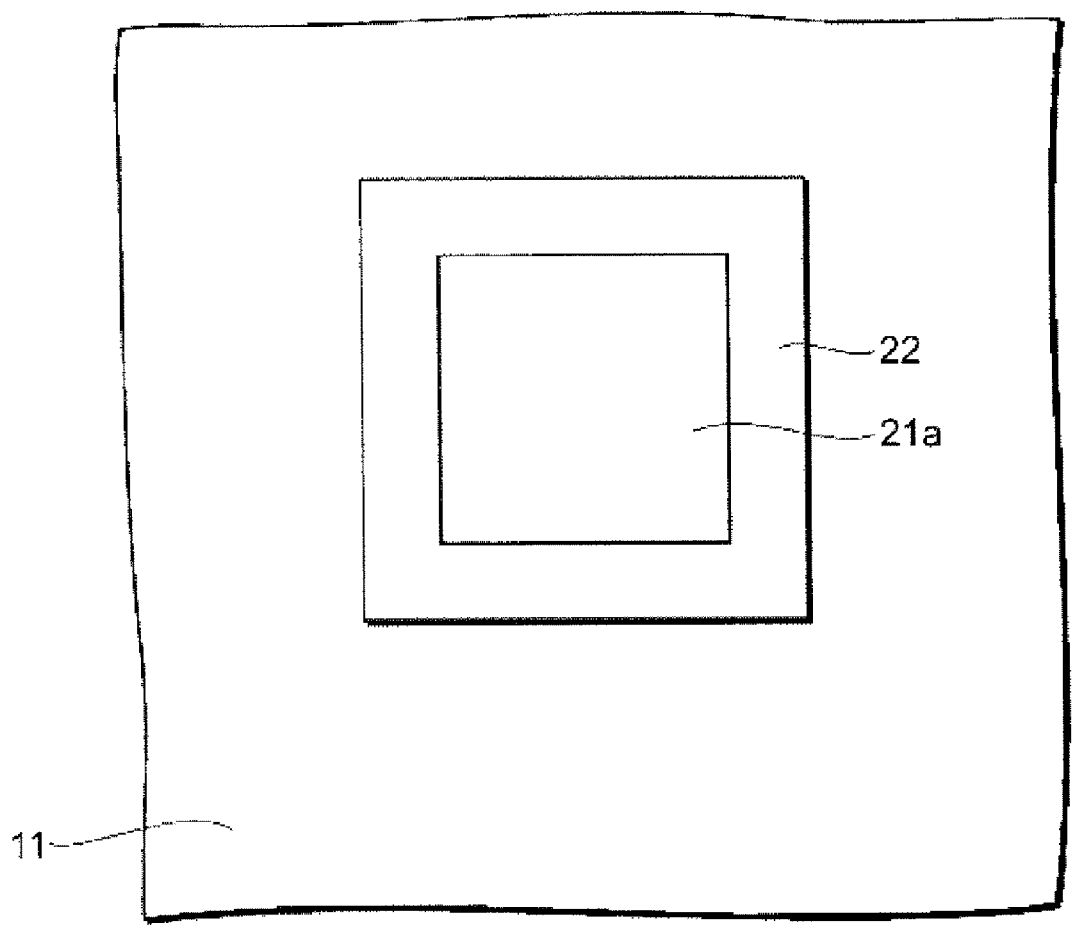
FIG. 4 is an exemplary plan view of a semiconductor package mounted on the printed circuit board according to the first embodiment.

A mechanism for radiating the heat generated by the die 21a is explained with reference to FIGS. 4 to 6. FIG. 4 is a plan view of the semiconductor package mounted on the printed circuit board 11, excluding the heat pipe 13, the fixation member 26, and the heat receiving plate 14a. As illustrated in FIG. 4, the resin substrate 22 and the die 21a mounted on the top surface of the resin substrate 22 are mounted on the printed circuit board 11 via solder balls 18 illustrated in FIG. 6 serving as connection terminals by soldering. As illustrated in FIG. 4, in the plan view, the die 21a is approximately square and the resin substrate 22 is also approximately square and has an area larger than that of the die 21a. The semiconductor package including the resin substrate 22, the die 21a, and the solder balls 18 can be sealed with, for example, synthetic resin.

Figure 5:
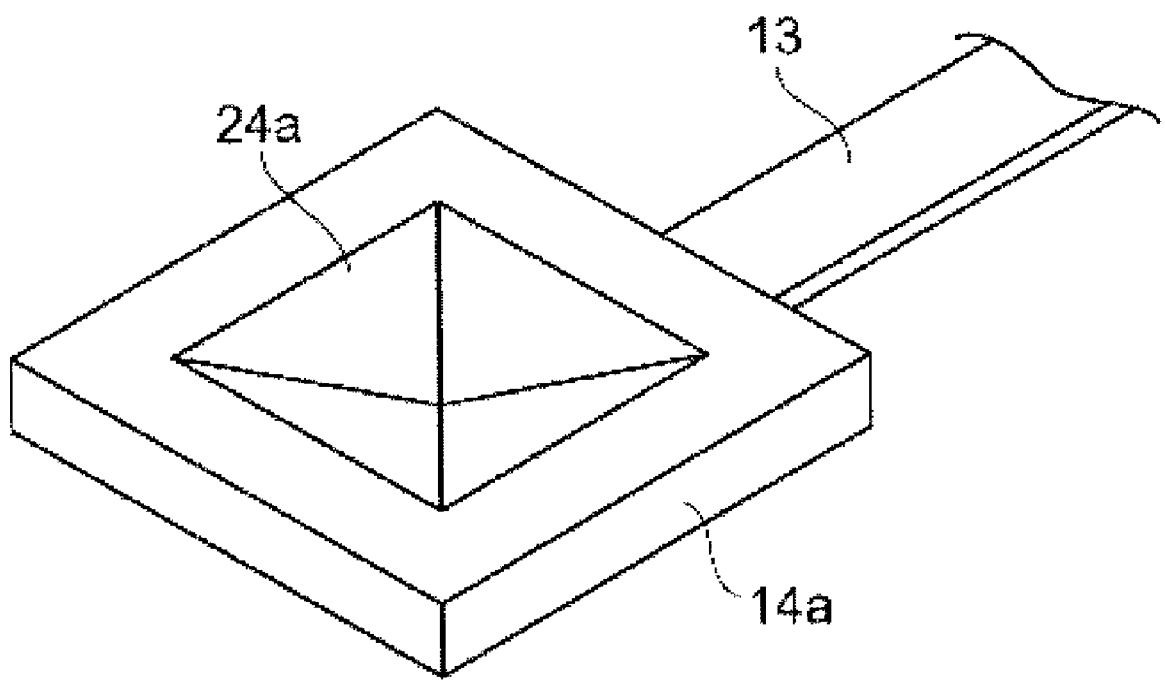
FIG. 5 is an exemplary perspective view of a grease reservoir of a heat receiving plate according to the first embodiment.

FIG. 5 is a perspective view of a grease reservoir 24a of the heat receiving plate 14a, i.e., a schematic diagram of a bottom surface of the heat receiving plate 14a. As illustrated in FIG. 5, the heat receiving plate 14a has an approximately square shape corresponding to that of the resin substrate 22 and, in the plan view, has an area larger than those of the die 21a and the resin substrate 22. The heat receiving plate 14a has the grease reservoir 24a on its bottom surface. The grease reservoir 24a has a concave and approximately square-pyramid shape corresponding to the approximately square shape of the die 21a on the plan view. The grease reservoir 24a is positioned on an inner side with respect to a circumference of the surface of the die 21a. The depth of the grease reservoir 24a gradually increases from the periphery to the center portion.

Figure 6:
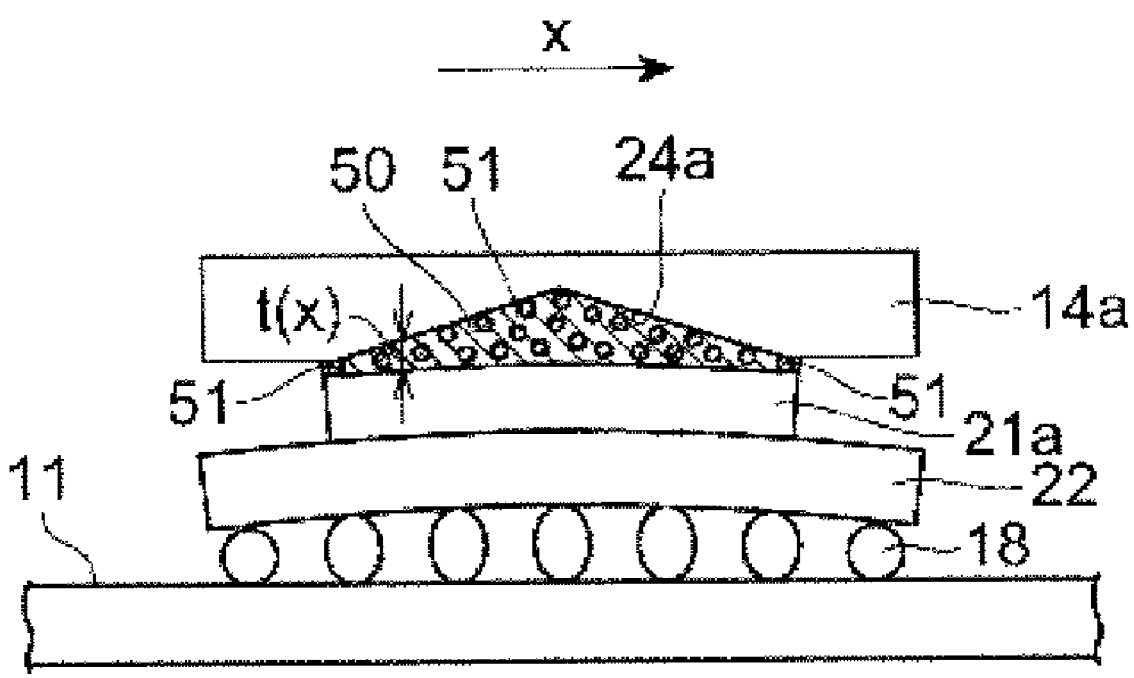
FIG. 6 is an exemplary schematic diagram of the semiconductor package, grease, and the heat receiving plate according to the first embodiment at a normal temperature.

FIG. 6 is a schematic diagram of the semiconductor package, the grease 50, and the heat receiving plate 14a at the normal temperature. As illustrated in FIG. 6, the semiconductor package includes the resin substrate 22, the die 21a, and the solder balls 18 fixed to the bottom surface of the resin substrate 22 by soldering. The semiconductor package is fixed to the printed circuit board 11 with the solder balls 18 by soldering.

The resin substrate 22 and the die 21a having a coefficient of linear expansion higher than that of the die 21a are connected to each other by a process that requires a higher temperature, such as soldering. As a result, at the normal temperature, the thermal connection surface of the die 21a with respect to the heat receiving plate 14a has a convex surface with respect to the heat receiving plate 14a. In the description, the normal temperature refers to 20° C. of the standard atmospheric conditions defined by Japanese Industrial Standards (JIS) Z8703 and the permissible tolerance is 20° C.±15° C. of the temperature class 15 defined by JIS Z8703 3.1 (permissible tolerance of temperature in standard atmospheric conditions).

Because the heat receiving plate 14a has on its bottom surface the grease reservoir 24a that has the concave and approximately square-pyramid shape, the interval between the grease reservoir 24a (the bottom surface of the heat receiving plate 14a) and the die 21a is the smallest in a peripheral portion of the space formed between the grease reservoir 24a and the die 21a when the heat receiving plate 14a is arranged on the die 21a. The interval between the grease reservoir 24a and the die 21a gradually increases from the peripheral portion of the space to a center portion of the space and is the largest in the center portion. The grease reservoir 24a is positioned on an inner side with respect to a position corresponding to the periphery of the thermal connection surface of the die 21a.

The space between the grease reservoir 24a and the die 21a is filled with the grease 50 serving as a heat conductive agent. The fillers 51 such as ceramics or metal powder for improving the heat conductivity are mixed into the grease 50. The heat receiving plate 14a is pressed against the die 21a with a standard pressure. The interval between the heat receiving plate 14a and the die 21a is kept at an interval $t(x)$ in a position in the direction x indicated by the arrow illustrated in FIG. 6 based on the viscosity of the grease 50 and the size of the filler 51. Specifically, the size of the filler 51 is taken as the interval $t(x)$ between the grease reservoir 24a and the die 21a in the peripheral portion of the space, and the interval $t(x)$ between the grease reservoir 24a and the die 21a in portions of the space other than the peripheral portion is determined based on the interval $t(x)$ of the peripheral portion.

The space between the grease reservoir 24a and the die 21a is filled with an amount of the grease 50 equivalent to a space volume V of the space between the grease reservoir 24a and the die 21a at the normal temperature. As described below, during operation, the die 21a has a small curvature and the grease 50 expands at the temperature during operation. In consideration of the above characteristics, the difference between the volume of the grease 50 at the normal temperature and the volume of the grease 50 increased with an increase in the temperature of the die 21a from the normal temperature to a constant heat generation temperature Tn within an operation temperature range is set equal to the difference between the space volume V at the normal temperature and the space volume V when the die 21a is at the constant heat generation temperature Tn.

Figure 7:
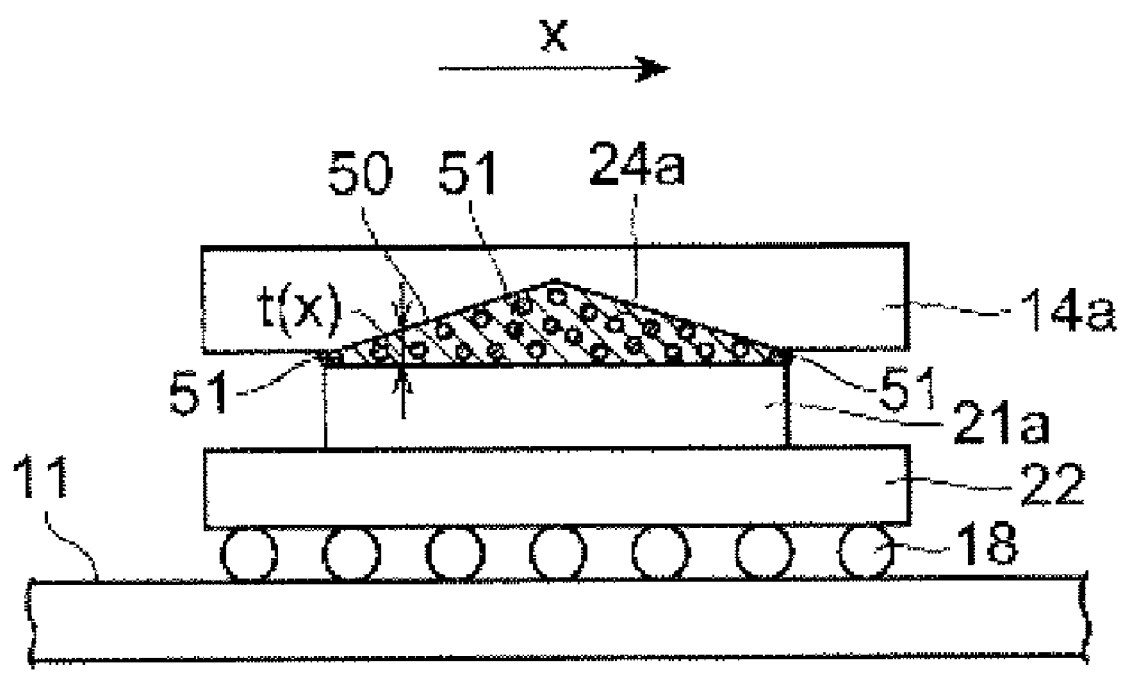
FIG. 7 is an exemplary schematic diagram of the semiconductor package, the grease, and the heat receiving plate according to the first embodiment during operation.

How heat is transmitted in the computer 1 is explained below with reference to FIGS. 7 to 9. FIG. 7 is a schematic diagram of the semiconductor package, the grease 50, and the heat receiving plate 14a during operation. As illustrated in FIG. 7, during operation, the temperature of the heat generated by the die 21a increases to a temperature close to that at which the die 21a and the resin substrate 22 are connected to each other, so that the shape of the thermal connection surface of the die 21a changes from the convex shape to an approximately flat shape with a smaller curvature. During operation, the space volume V of the space increases because the interval t(x) in the peripheral portion of the space between the grease reservoir 24a and the die 21a, which is determined by the size of the filler 51, hardly changes while the interval t(x) in the portions other than the peripheral portion increases with a decrease in the curvature of the portions. In addition, with the increase in the temperature of the die 21a during operation, the viscosity of the grease 50 decreases, so that the fluidity and volume of the grease increases.

Figure 8:
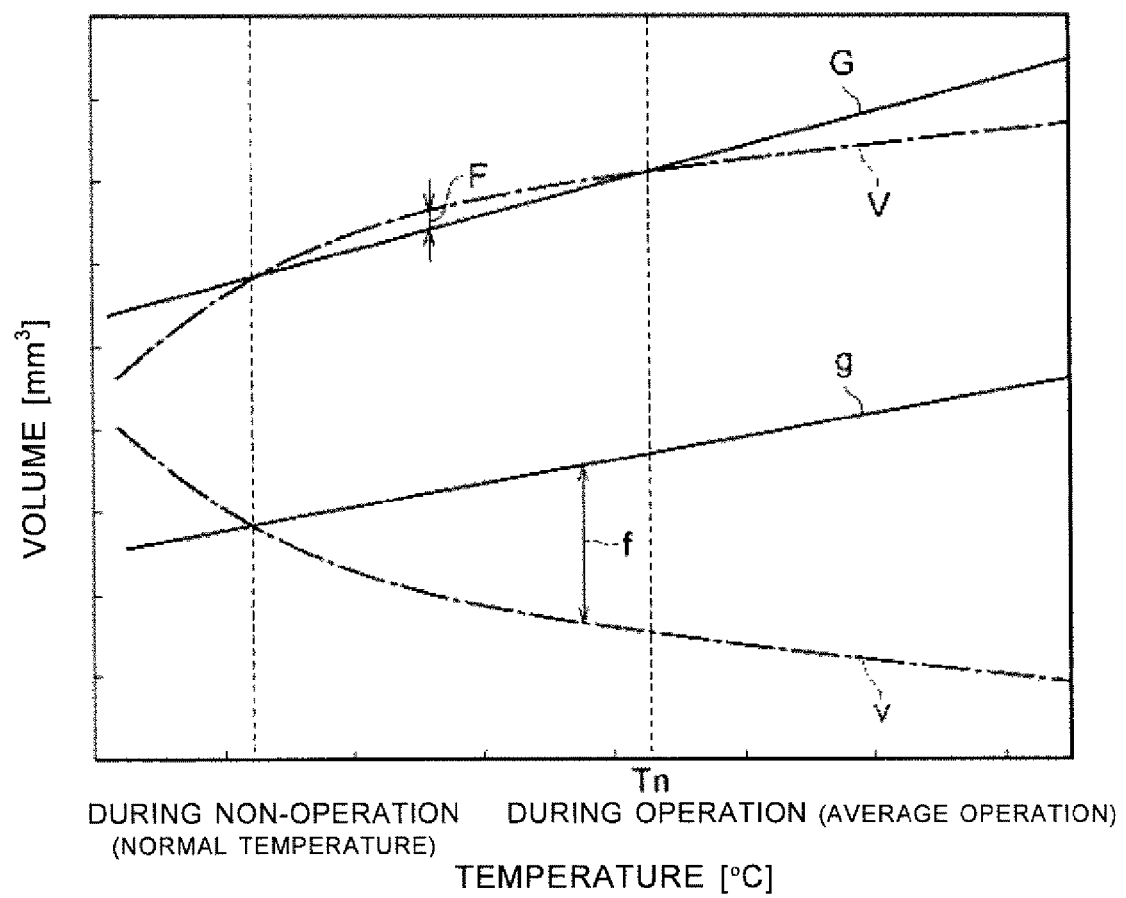
FIG. 8 is a graph exemplifying a relation between space volume and grease volume with respect to temperature.

FIG. 8 is a graph of a relation between space volume and grease volume with respect to temperature. As illustrated in FIG. 8, a grease volume g increases while a space volume v decreases with an increase in the temperature of the die 21a from the normal temperature to the constant heat generation temperature Tn during operation, which results in a larger amount f of grease leakage, where the grease volume g and the space volume v are of a semiconductor package without the grease reservoir 24a, as illustrated in FIGS. 17 and 18.

On the other hand, in the configuration of the first embodiment, both a grease volume G and a space volume V increase approximately equally with a change in the temperature of the die 21a from the normal temperature to the constant heat generation temperature Tn within the operation temperature range. As a result, an amount of F of grease leakage obtained by subtracting the space volume V from the grease volume G is small, i.e., a negative value. In other words, the space volume V is maintained being slightly larger than the grease volume G. At the constant heat generation temperature Tn during operation, the space volume V and the grease volume G are equal to each other. In other words, in the first embodiment, when the die 21a is at a temperature in the range from the normal temperature to the constant heat generation temperature Tn, V≧G (space volume≧grease volume) is satisfied.

The constant heat generation temperature Tn of the die 21a refers to the surface of the die 21a on which heat is generated in the state where the die 21 is incorporated in the electronic apparatus and performs the standard operation. The constant heat generation temperature Tn can be arbitrarily set depending on the characteristics of a semiconductor element of the die 21a.

Figure 9:
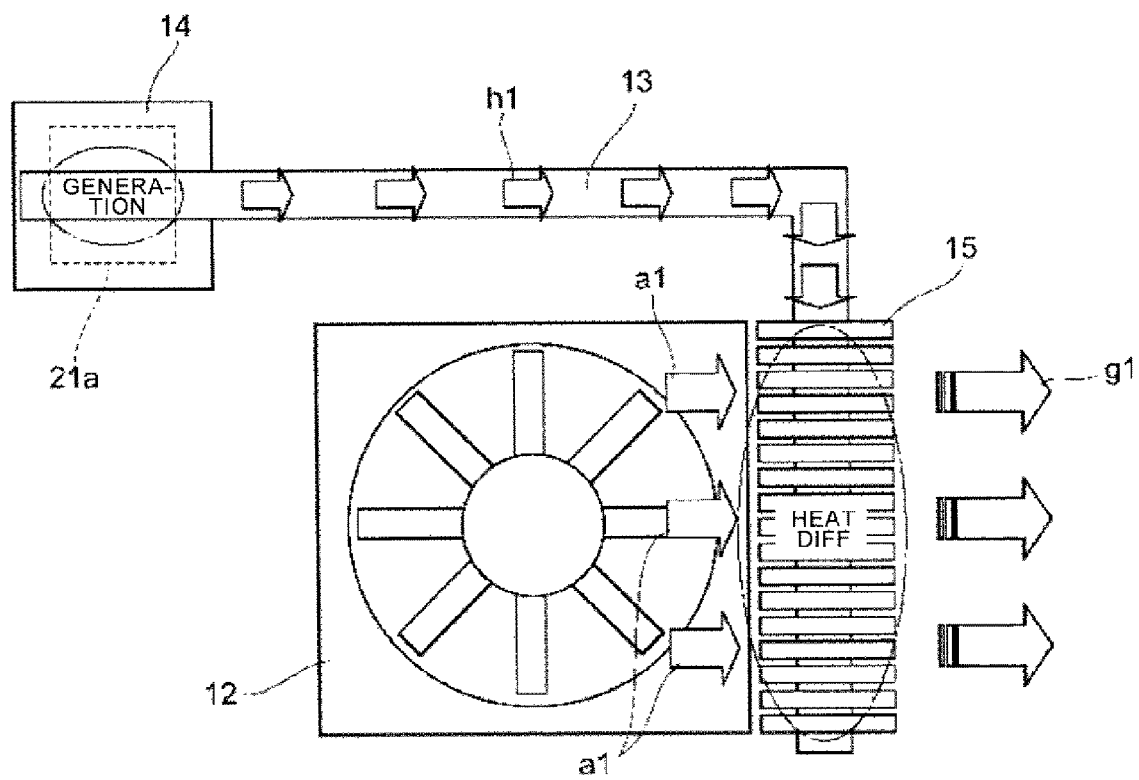
FIG. 9 is an exemplary diagram depicting how heat generated by a die is radiated.

As illustrated in FIG. 9, heat h1 generated by the die 21a is transmitted to the heat receiving plate 14a. Thereafter, the heat h1 is transmitted from the heat receiving plate 14a to the heat radiation fin 15 via the heat pipe 13. When the cooling fan 12 is driven, air a1 is introduced from the intake holes 17d and 17e of the intake surfaces 17a and 17b to the inside of the housing case 17. The air a1 is then discharged from the discharge surface 17c such that the air a1 blows the heat radiation fin 15. When the air blows the heat radiation fin 15, heat exchange occurs between the heat radiation fin 15 and the air a1 discharged from the cooling fin 12. Specifically, the heat h1 conducted from the die 21a to the heat radiation fin 15 is transmitted to the air at. Thereafter, the air a1 is discharged to the outside of the chassis 6 via the discharge holes 28, as exhaust heat g1. This accelerates cooling the die 21a.

In the first embodiment, the heat receiving plate 14a has on its bottom surface the grease reservoir 24a having the concave shape corresponding to the curvature of the die 21a, and the space between the heat receiving plate 14a and the die 21a is filled with the grease 50. As the curvature of the die 21a decreases at the temperature during operation, the space volume V increases. Therefore, even when the volume of the grease 50 increases at the temperature during operation, leakage of the grease 50 can be prevented, stable thermal connection between the heat receiving plate 14a and the die 21a can be achieved, and the reliability of thermal connection can be improved.

In the first embodiment, because the grease reservoir 24a is positioned on the inner side with respect to the circumference of the die 21a, leakage of the grease 50 at the periphery of the grease reservoir 24a can be prevented. Furthermore, during operation, the space volume V can be increased because the interval t(x) between the grease 24a and the die 21a in the center portion of the space increases.

In the first embodiment, the space volume V of the space between the surface of the die 21a and the grease reservoir 24a at the normal temperature is equal to the volume of the grease 50 at the normal temperature. In addition, the space volume V of the space between the surface of the die 21a and the grease reservoir 24a when the die 21a is at the constant heat generation temperature Tn is set equal to the volume of the grease 50 when the die 21a is at the constant heat generation temperature Tn. Therefore, both at the normal temperature and at the constant heat generation temperature Tn, an excess or a deficiency in the space volume V with respect to the grease volume G is not caused. This leads to more stable thermal connection between the heat receiving plate 14a and the die 21a, which further improves the reliability of thermal connection.

Figure 10:
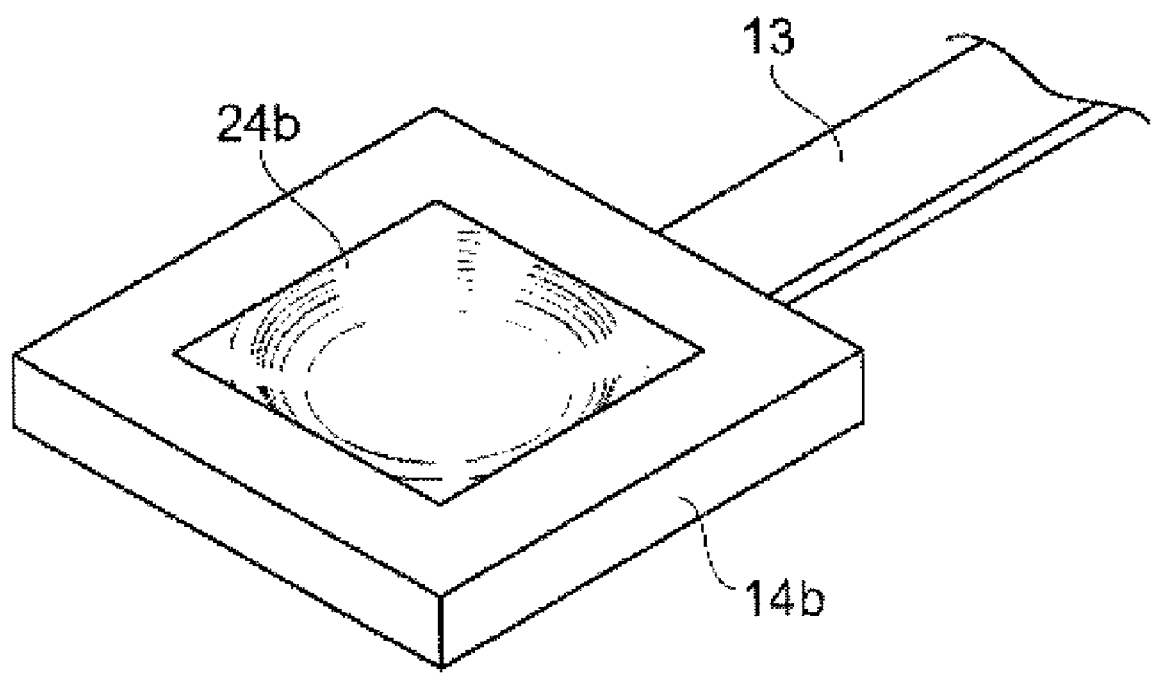
FIG. 10 is an exemplary perspective view of a grease reservoir of a heat receiving plate according a second embodiment of the invention.
Figure 11:
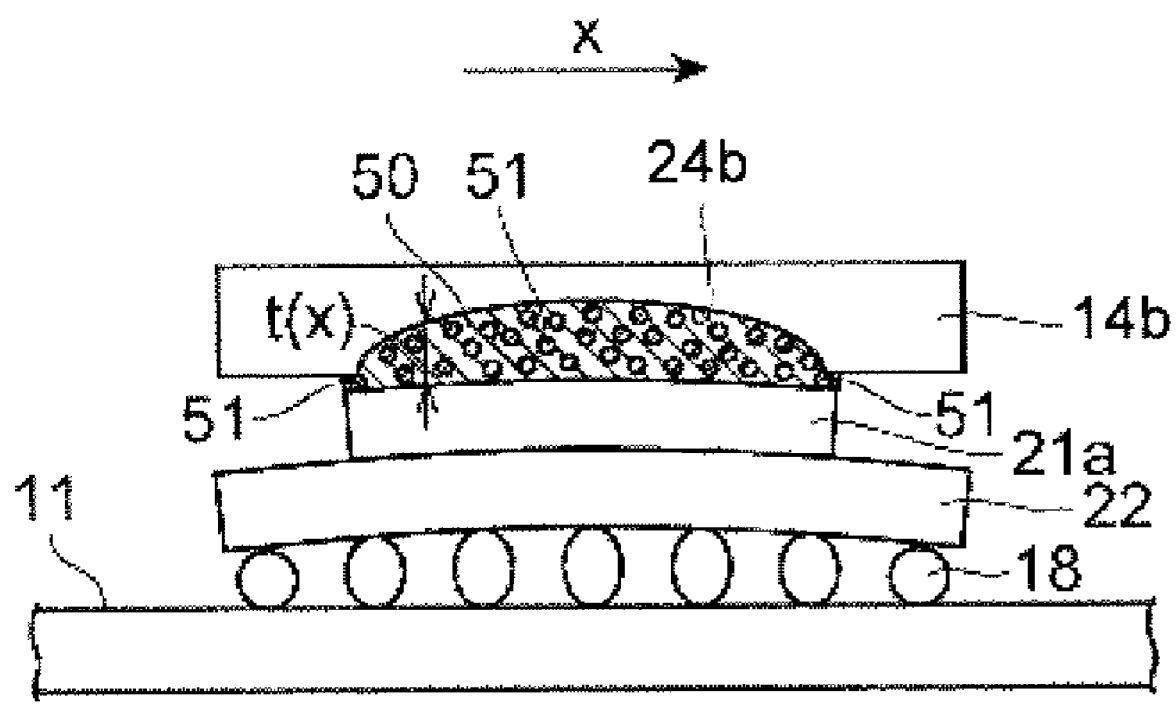
FIG. 11 is an exemplary schematic diagram of a semiconductor package, grease, and the heat receiving plate according to the second embodiment at the normal temperature.

A second embodiment of the present invention is explained below. FIG. 10 is a perspective view of a grease reservoir 24b of a heat receiving plate 14b according to the second embodiment. FIG. 11 is a schematic diagram of a semiconductor package, the grease 50, and the heat receiving plate 14b according to the second embodiment at the normal temperature. As illustrated in FIGS. 10 and 11, the second embodiment is different from the first embodiment in that the concave shape of the grease reservoir 24b of the heat receiving plate 14b is formed by a curved surface corresponding to the curvature of the die 21a.

In the second embodiment, the convex shape of the grease reservoir 24b is formed by the curved surface corresponding to the curvature of the die 21a. Therefore, even when the shape of the thermal connection surface of the die 21a changes from the convex shape to an approximately flat shape with a smaller curvature, a force to be applied from the surface of the grease reservoir 24b to the grease 50 is small, so that the grease 50 and the fillers 51 contained in the grease 50 do not move easily. This leads to more stable thermal connection between the heat receiving plate 14b and the die 21a, which further improves the reliability of thermal connection.

Figure 12:
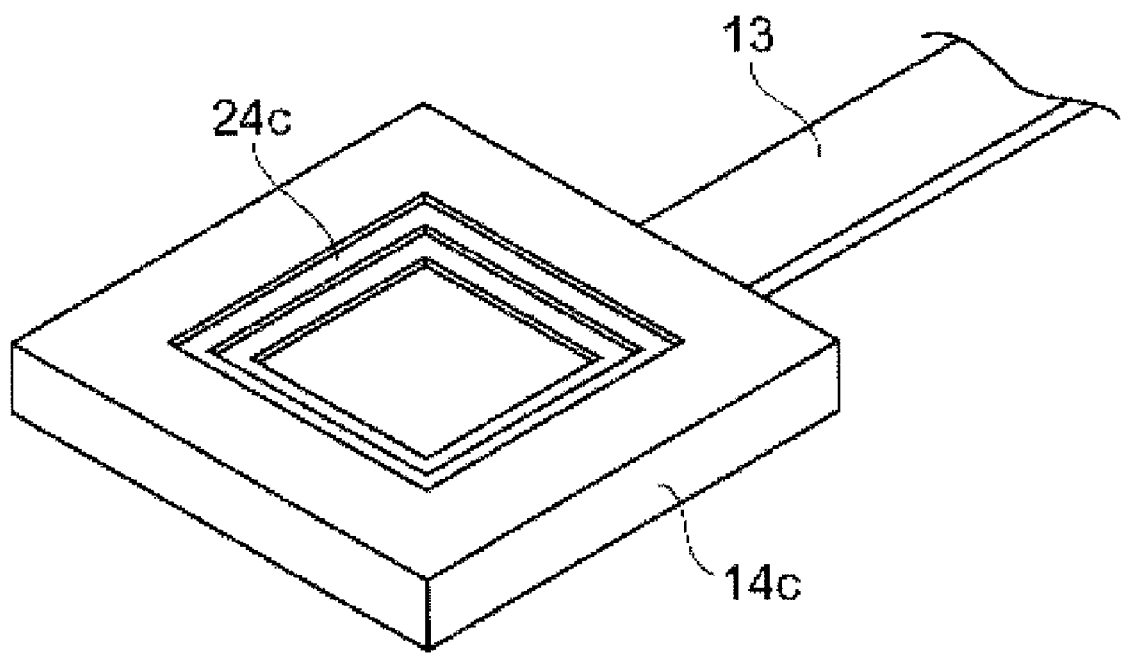
FIG. 12 is an exemplary perspective view of a grease reservoir of a heat receiving plate according a third embodiment of the invention.
Figure 13:
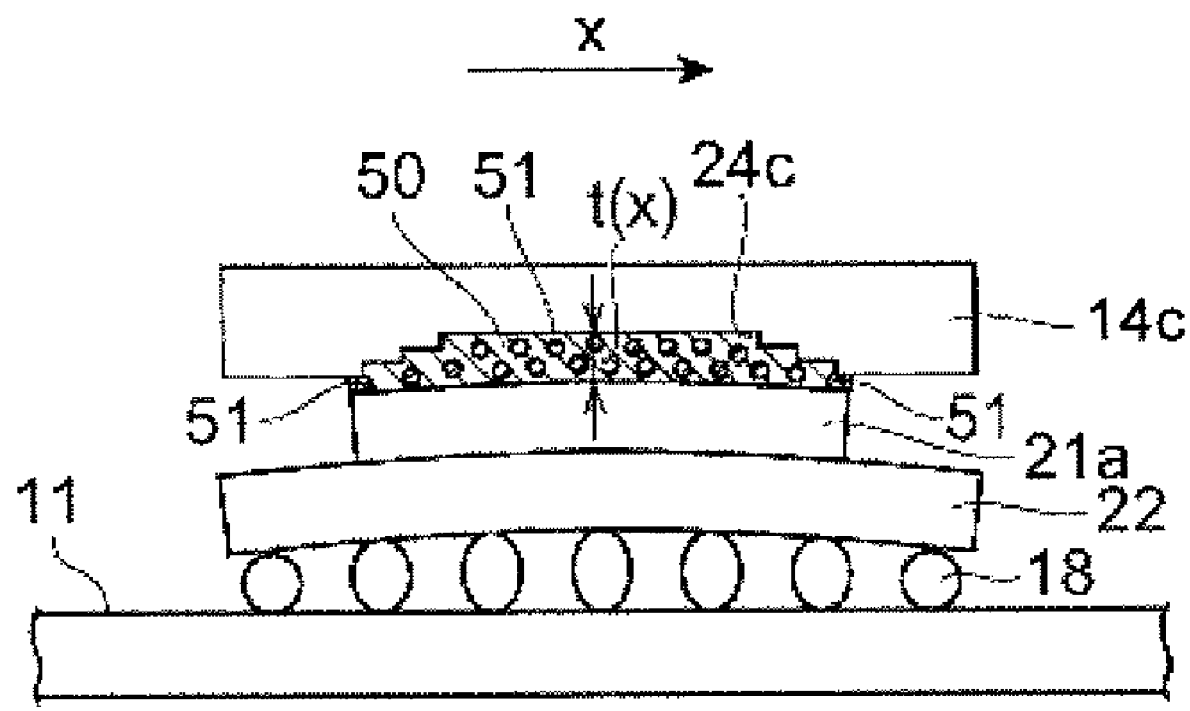
FIG. 13 is an exemplary schematic diagram of a semiconductor package, grease, and the heat receiving plate according to the third embodiment at the normal temperature.

A third embodiment of the present invention is explained below. FIG. 12 is a perspective view of a grease reservoir 24c of a heat receiving plate 14c according to the third embodiment. FIG. 13 is a schematic diagram of a semiconductor package, the grease 50, and the heat receiving plate 14c according to the third embodiment at the normal temperature. As illustrated in FIGS. 12 and 13, the third embodiment is different from the first embodiment in that the grease reservoir 24c of the heat receiving plate 14c has a stepwise surface and the depth of the grease reservoir 24c increases stepwise. In other words, the interval between the heat receiving plate 14c and the die 21a increases stepwise from a peripheral portion of the space formed between the heat receiving plate 14c and the die 21a when the heat receiving plate 14c is arranged on the die 21a to a center portion of the space.

In the third embodiment, as described above, the depth of the grease reservoir 24c increases stepwise, i.e., the interval between the heat receiving plate 14c and the die 21a increases stepwise from the peripheral portion of the space between the heat receiving plate 14c and the die 21a to the center portion of the space. This advantageously makes it relatively easier to analyze the interval t(x) and the space volume V.

Figure 14:
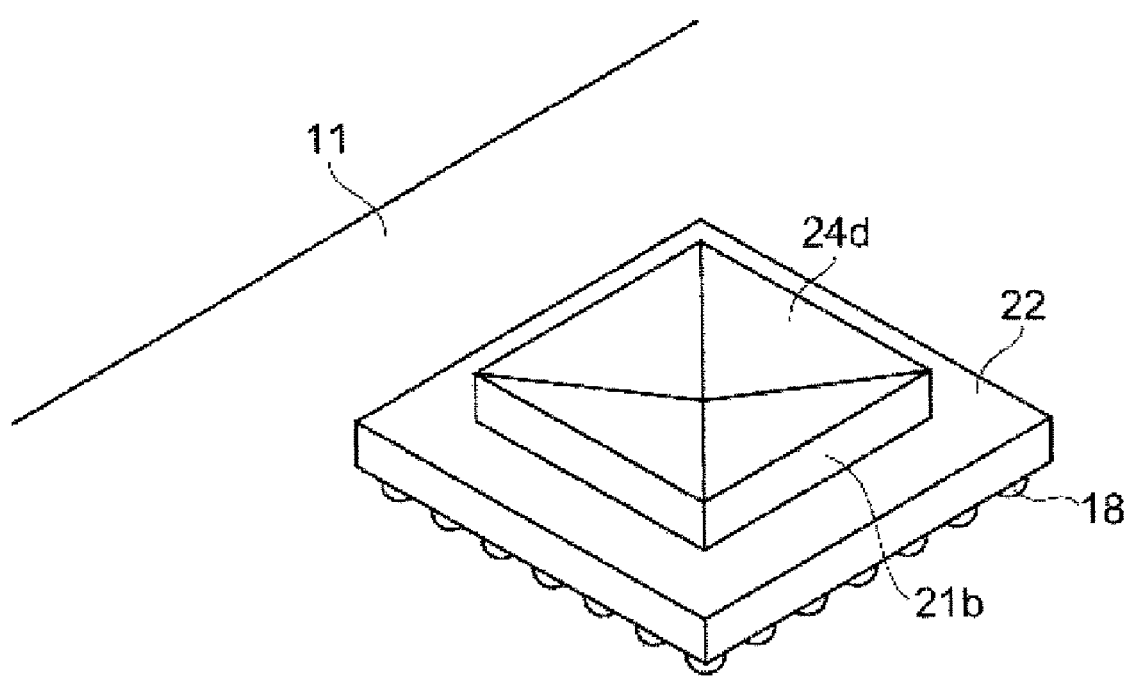
FIG. 14 is an exemplary perspective view of a semiconductor package mounted on a printed circuit board according to a fourth embodiment of the invention.

A fourth embodiment of the present invention is explained below. FIG. 14 is a perspective view of a semiconductor package mounted on the printed circuit board 11 according to the fourth embodiment. As illustrated in FIG. 14, the fourth embodiment is different form the first embodiment in that a grease reservoir 24d is formed not on the heat receiving plate 14 but on a die 21b. The die 21b has on its top surface the grease reservoir 24d (thermal connection surface) that has a concave and approximately square-pyramid shape. The depth of the grease reservoir 24d gradually increases from the periphery to the center portion.

Figure 15:
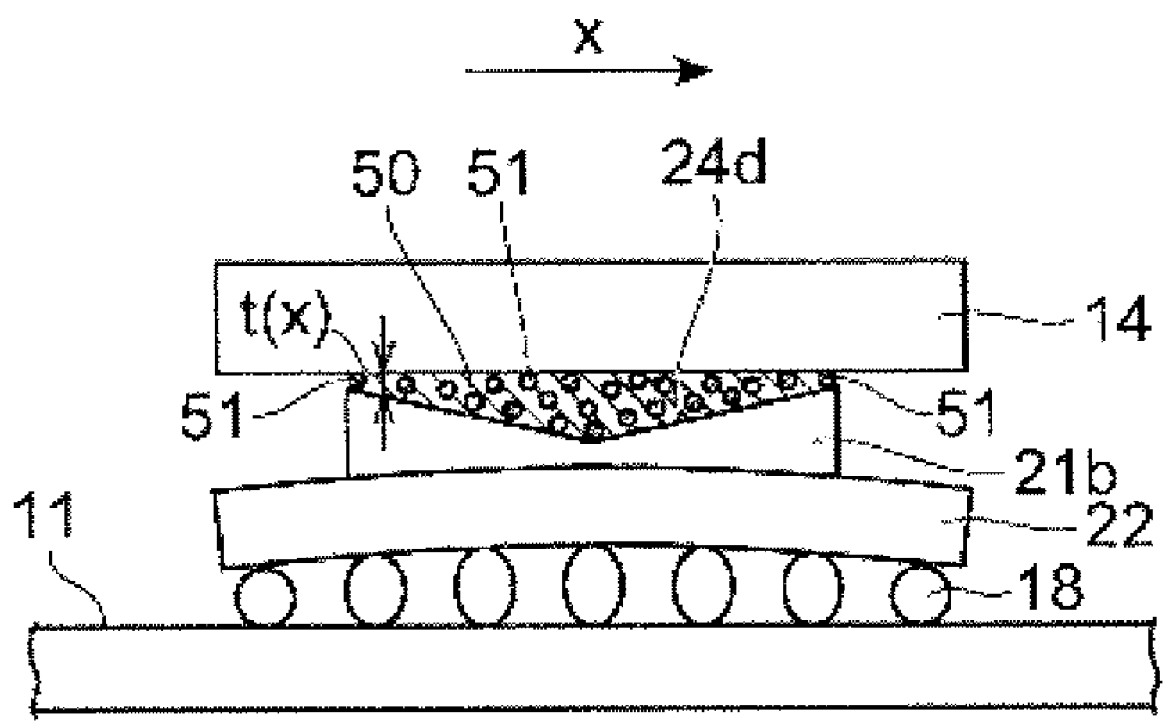
FIG. 15 is an exemplary schematic diagram of the semiconductor package, grease, and a heat receiving plate according to the fourth embodiment at the normal temperature.

FIG. 15 is a schematic diagram of the semiconductor package, the grease 50, and the heat receiving plate 14 according to the fourth embodiment at the normal temperature. As illustrated in FIG. 15, at the normal temperature, the semiconductor package including the die 21b, the resin substrate 22, and the solder balls 18 is convex with respect to the heat receiving plate 14. On the other hand, the thermal connection surface of the die 21b with respect to the heat receiving plate 14 is concave with respect to the heat receiving plate 14 because of the grease reservoir 24d.

In the fourth embodiment, as explained above, the die 21b has on its upper surface the grease reservoir 24d that has the concave and approximately square-pyramid shape. Specifically, the interval between the heat receiving plate 14 and the grease reservoir 24d (the upper surface of the die 21b) is the smallest in a peripheral portion of the space, which is formed between the heat receiving plate 14 and the grease reservoir 24d when the heat receiving plate 14 is arranged on the die 21b, gradually increases from the peripheral portion of the space to a center portion of the space, and is the largest in a center portion of the space.

The space between the heat receiving plate 14 and the grease reservoir 24d is filled with the grease 50. The heat receiving plate 14 is pressed against the die 21b with the standard pressure. The size of the filler 51 is taken as an interval t(x) between the heat receiving plate 14 and the grease reservoir 24d in the peripheral portion of the space between the heat receiving plate 14 and the grease reservoir 24d, and the interval t(x) in portions of the space other than the peripheral portion is determined based on the interval t(x) in the peripheral portion.

The space between the heat receiving plate 14 and the grease reservoir 24d is filled with an amount of the grease 50 equal to a space volume V of the space between the heat receiving plate 14 and the grease reservoir 24d at the normal temperature. As the first embodiment, during operation, the die 21b has a small curvature and the grease 50 expands at the temperature during operation. In consideration of the above characteristics, the difference between the volume of the grease 50 at the normal temperature and the volume of the grease 50 increased with an increase in the temperature of the die 21b from the normal temperature to the constant heat generation temperature Tn is set equal to the difference between the space volume V at the normal temperature and the space volume V when the die 21b is at the constant heat generation temperature Tn.

Figure 16:
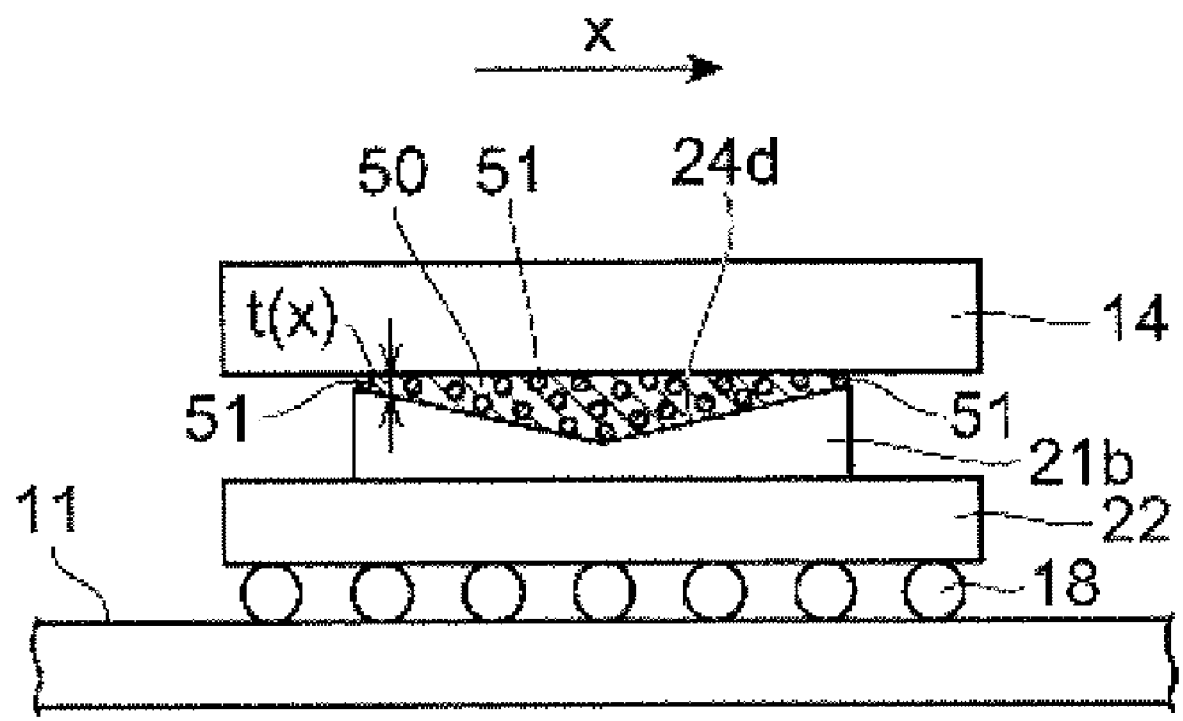
FIG. 16 is an exemplary schematic diagram of the semiconductor packager the grease, and the heat receiving plate according to the fourth embodiment during operation.

FIG. 16 is a schematic diagram of the semiconductor package, the grease 50, and the heat receiving plate 14 according to the fourth embodiment during operation. As illustrated in FIG. 16, during operation, the temperature of the heat generated by the die 21b increases to a temperature close to that at which the die 21b and the resin substrate 22 are connected to each other, so that the shape of the die 21b changes from the convex shape to an approximately flat shape with a smaller curvature. During operation, because the interval t(x) in the peripheral portion of the space determined by the size of the filler 51 hardly changes while the interval t(x) in the portions other than the peripheral portion increases with a decrease in the curvature of the portions, the space volume V increases. In addition, with the increase in the temperature of the die 21b during operation, the viscosity of the grease 50 decreases, so that the fluidity and volume of the grease increases. In other words, as the first embodiment, both the grease volume G and the space volume V increase approximately equally with a change in the temperature of the die 21b from the normal temperature to the constant heat generation temperature Tn. At the constant heat generation temperature Tn of the die 21a during operation, the space volume V and the grease volume G are equal to each other.

Because the grease reservoir 24d is formed on the die 21b in the fourth embodiment, as the first embodiment, leakage of the grease 50 can be prevented and stable thermal connection between the heat receiving plate 14 and the die 21b can be achieved, which improves the reliability of thermal connection.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. An electronic apparatus comprising:
   a semiconductor package comprising a resin substrate and a die mounted on the resin substrate;
   a printed circuit board on which the semiconductor package is mounted; and
   a heat receiving plate having an area larger than an area of the die, wherein
   the heat receiving plate has a concave portion corresponding to a shape of a surface of the die at a normal temperature,
   the concave portion is provided with a pasty heat conductive agent, and
   the heat receiving plate is thermally connected to the semiconductor package via the pasty heat conductive agent.

2. The electronic apparatus according to claim 1, wherein the concave portion is positioned in an inner side with respect to a position corresponding to a circumference of the surface of the die.

3. The electronic apparatus according to claim 1, wherein
   a volume of a space formed between the concave portion and the surface of the die at the normal temperature is equal to a volume of the pasty heat conductive agent at the normal temperature, and
   the volume of the space between the concave portion and the surface of the die when the die is at a first temperature within an operation temperature range is equal to the volume of the pasty heat conductive agent when the die is at the first temperature.

4. The electronic apparatus according to claim 1, wherein the concave portion is formed by a curved surface.

5. The electronic apparatus according to claim X, further comprising:
   a discharge hole;
   a heat radiation fin that is opposed to the discharge hole; and
   a heat conductive member that thermally connects the die and the heat radiating fin.

6. An electronic apparatus comprising:
   a semiconductor package comprising a resin substrate and a die mounted on the resin substrate;
   a printed circuit board on which the semiconductor package is mounted; and
   a heat receiving plate having an area larger than an area of the die, wherein
   the die has a concave portion that is provided with a pasty heat conductive agent, and
   the die is thermally connected to the heat receiving plate via the pasty heat conductive agent.

* * * * *